United States Patent
Lee et al.

(10) Patent No.: US 8,810,124 B2
(45) Date of Patent: Aug. 19, 2014

(54) AC LIGHT EMITTING DEVICE WITH LONG-PERSISTENT PHOSPHOR AND LIGHT EMITTING DEVICE MODULE HAVING THE SAME

(75) Inventors: Chung Hoon Lee, Ansan-si (KR); Yeo Jin Yoon, Ansan-si (KR); Dae Won Kim, Ansan-si (KR); Dae Sung Kal, Ansan-si (KR); Kyung Hee Ye, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 406 days.

(21) Appl. No.: 12/581,507

(22) Filed: Oct. 19, 2009

(65) Prior Publication Data

US 2010/0096977 A1    Apr. 22, 2010

(30) Foreign Application Priority Data

Oct. 21, 2008 (KR) .................. 10-2008-0102837
Nov. 3, 2008 (KR) .................. 10-2008-0108172

(51) Int. Cl.
*H05B 33/14* (2006.01)
*H05B 33/08* (2006.01)
*F21K 99/00* (2010.01)
*H01L 25/075* (2006.01)
*H01L 33/50* (2010.01)
*F21Y 113/00* (2006.01)

(52) U.S. Cl.
CPC ......... *F21K 9/00* (2013.01); *H01L 2224/48137* (2013.01); *H05B 33/0821* (2013.01); *H01L 25/0753* (2013.01); *H01L 33/50* (2013.01); *F21K 9/56* (2013.01); *F21Y 2113/005* (2013.01); *F21K 9/54* (2013.01); *H01L 2224/49107* (2013.01)
USPC ........................................ 313/503; 313/501

(58) Field of Classification Search
USPC ............... 257/40, 72, 98–100, 642–643, 759; 313/498–512, 110–117; 315/169.1, 315/169.3; 427/58, 64, 66, 532–535, 539; 428/690–691, 917; 438/26–29, 34, 82, 438/455; 445/24–25
See application file for complete search history.

(56) References Cited

U.S. PATENT DOCUMENTS 3,639,729 A * 2/1972 Marshall .................. 178/17 A
7,009,199 B2 * 3/2006 Hall ........................... 257/14
(Continued)

FOREIGN PATENT DOCUMENTS

JP    2000-164935    6/2000
JP    2003-069084    3/2003
(Continued)

*Primary Examiner* — Donald Raleigh
(74) *Attorney, Agent, or Firm* — H.C. Park & Associates, PLC

(57) ABSTRACT

Disclosed are an AC light emitting device with a long-persistent phosphor and an AC light emitting device module having the same. According to an exemplary embodiment of the present invention, the light emitting device includes a first light emitting diode chip and a second light emitting diode chip, each of which has a plurality of light emitting cells on a single substrate. Further, a first long-persistent phosphor is positioned on the first light emitting diode chip to perform wavelength conversion for a portion of light emitted from the first light emitting diode chip; and a second long-persistent phosphor is positioned on the second light emitting diode chip to perform wavelength conversion for a portion of light emitted from the second light emitting diode chip. The afterglow luminescence resulted from the second long-persistent phosphor is allowed to be different from that resulted from the first long-persistent phosphor, whereby a flicker effect of the AC light emitting device can be more alleviated.

9 Claims, 8 Drawing Sheets

(56) References Cited

U.S. PATENT DOCUMENTS

| | | | |
|---|---|---|---|
| 7,740,514 B2* | 6/2010 | Setlur et al. | 445/23 |
| 7,777,412 B2* | 8/2010 | Pang | 313/506 |
| 8,227,273 B2* | 7/2012 | Leising | 438/29 |
| 2002/0093287 A1* | 7/2002 | Chen | 313/512 |
| 2004/0016938 A1* | 1/2004 | Baretz et al. | 257/100 |
| 2006/0105485 A1* | 5/2006 | Basin et al. | 438/27 |
| 2006/0164004 A1* | 7/2006 | Rossner | 313/503 |
| 2007/0036988 A1* | 2/2007 | Tanaka et al. | 428/432 |
| 2007/0111344 A1 | 5/2007 | Leising | |
| 2007/0159067 A1* | 7/2007 | Yun et al. | 313/503 |
| 2007/0176194 A1* | 8/2007 | Wakamatsu et al. | 257/98 |
| 2007/0278500 A1* | 12/2007 | Lin | 257/81 |
| 2007/0284598 A1* | 12/2007 | Shakuda et al. | 257/93 |
| 2008/0128735 A1* | 6/2008 | Yoo et al. | 257/98 |
| 2008/0251796 A1* | 10/2008 | Lee et al. | 257/88 |
| 2009/0026913 A1* | 1/2009 | Mrakovich | 313/498 |
| 2009/0079351 A1* | 3/2009 | Choi et al. | 315/169.3 |
| 2009/0160330 A1* | 6/2009 | Hsu et al. | 313/506 |

FOREIGN PATENT DOCUMENTS

| | | | | |
|---|---|---|---|---|
| JP | 2004-297078 | | 10/2004 | |
| JP | 2006-306982 | | 11/2006 | |
| JP | 2007-234632 | | 9/2007 | |
| JP | 2008-171984 | | 7/2008 | |
| KR | 10-2006-0098229 | * | 9/2006 | H01L 33/00 |
| KR | 1020070047056 | | 5/2007 | |
| KR | 100746952 | | 8/2007 | |
| WO | 2007/001116 | | 1/2007 | |

* cited by examiner

AC LIGHT EMITTING DEVICE WITH LONG-PERSISTENT PHOSPHOR AND LIGHT EMITTING DEVICE MODULE HAVING THE SAME

CROSS-REFERENCE TO RELATED APPLICATIONS

This application claims priority from and the benefit of Korean Patent Application No. 10-2008-0102837, filed on Oct. 21, 2008, and Korean Patent Application No. 10-2008-0108172, filed on Nov. 3, 2008, which are hereby incorporated by reference for all purposes as if fully set forth herein.

BACKGROUND OF THE INVENTION

1. Field of the Invention

Exemplary embodiments of the present invention relate to a light emitting device, and more particularly, to an AC light emitting device in which a long-persistent phosphor is adopted to prevent a flicker effect and a light emitting device module having the same.

2. Discussion of the Background

Recently, a light emitting device that is directly connected to an alternating current (AC) power source to operate under AC power has been developed. Such a light emitting device includes a light emitting diode chip having a plurality of light emitting cells on a single substrate. The light emitting device may directly operate under AC power by connecting the arrays of light emitting cells to each other in anti-parallel or by connecting the array of light emitting cells to a bridge rectifier.

However, whenever a phase of the AC power is changed, On/Off operations are reiterated in the light emitting diode chip that operates under AC power so that homogeneous light cannot be continuously emitted from the light emitting diode chip and a flicker effect may be generated. When the AC light emitting device is used for a long time for the purpose of lighting, such a flicker effect may cause the fatigue of human eyes. Meanwhile, when the AC light emitting device is installed to an object moving at a rapid speed such as a vehicle, the flicker effect may cause the object to be observed with the naked eye.

In order to prevent such a flicker effect, an AC light emitting device using a delay unit has been disclosed in Korean Laid-Open Patent Publication No. 10-2007-47056 while an AC light emitting device adopting a long-persistent phosphor has been disclosed in Korean Patent No. 10-746952. According to these references, the flicker effect may be alleviated either by delaying a phase of AC power waveform or by emitting another light from the long-persistent phosphor which has a long decay time when the phases of the AC power change.

However, if a circuit such as a delay unit is additionally mounted together with an AC light emitting device, the cost required to install and operate the AC light emitting device increases, so that the substitution effect of the light emitting device for the general illumination is reduced. Further, since the afterglow luminescence of the light emitted from the long-persistent phosphor is relatively smaller than the luminescence of the light emitted from the light emitting diode, the alleviation of the flicker effect using the long-persistent phosphor has a limitation. In order to further alleviate the flicker effect, the amount of the long-persistent phosphor may be increased. However, an increase in the usage amount of the long-persistent phosphor causes an increase in the loss of light emitted from the light emitting diode, so that the total light emission output may be reduced.

SUMMARY OF THE INVENTION

Exemplary embodiments of the present invention provide an improved AC light emitting device capable of more alleviating a flicker effect.

Exemplary embodiments of the present invention also provide an AC light emitting device capable of preventing the total light emission output from being reduced as well as alleviating a flicker effect.

Exemplary embodiments of the present invention also provide an AC light emitting device capable of alleviating a flicker effect without an additional circuit for delaying an AC signal.

Additional features of the invention will be set forth in the description which follows, and in part will be apparent from the description, or may be learned by practice of the invention.

An exemplary embodiment of the present invention discloses an alternating current (AC) light emitting device comprising a first light emitting diode chip and a second light emitting diode chip, each of the first light emitting diode chip and the second light emitting diode chip comprising a plurality of light emitting cells; a first long-persistent phosphor disposed on the first light emitting diode chip to perform wavelength conversion of a portion of light emitted from the first light emitting diode chip; and a second long-persistent phosphor disposed on the second light emitting diode chip to perform wavelength conversion of at least a portion of light emitted from the second light emitting diode chip, wherein afterglow luminescence resulted from the second long-persistent phosphor is different from that resulted from the first long-persistent phosphor.

An exemplary embodiment of the present invention also discloses an AC light emitting device comprising a light emitting diode chip comprising a plurality of light emitting cells; a first long-persistent phosphor disposed on a first region of the light emitting diode chip to perform wavelength conversion of a portion of light emitted from the light emitting diode chip; and a second long-persistent phosphor disposed on a second region of the light emitting diode chip to perform wavelength conversion of a portion of light emitted from the light emitting diode chip, wherein the amount of the second long-persistent phosphor is different from that of the first long-persistent phosphor.

An exemplary embodiment of the present invention also discloses an AC light emitting device module comprising a first light emitting device and a second light emitting device, wherein each of the first light emitting device and the second light emitting device comprises a light emitting diode chip comprising a plurality of light emitting cells and a long-persistent phosphor to perform wavelength conversion for light emitted from the light emitting diode chip, and wherein afterglow luminescence resulted from the long-persistent phosphor in the second light emitting device is different from the long-persistent phosphor in the first light emitting device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
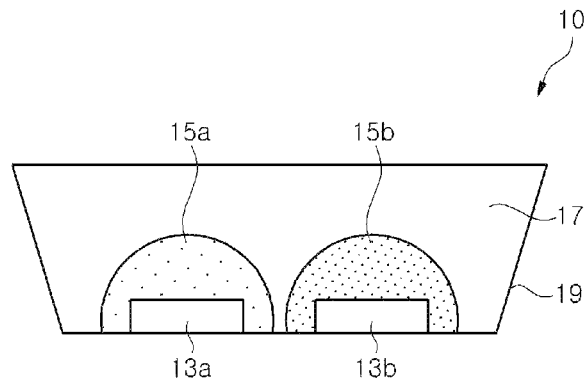
FIG. 1 is a schematic sectional view illustrating an AC light emitting device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a schematic sectional view illustrating an AC light emitting device according to an exemplary embodiment of the present invention.

Referring to FIG. 1, the light emitting device 10 includes light emitting diode chips 13a and 13b and long-persistent phosphors 15a and 15b respectively corresponding thereto. The light emitting device 10 may further include a molding member 17 and a reflective cup 19.

Each of the light emitting diode chips 13a and 13b has a plurality of light emitting cells, which may be serially connected to each other to define an array of light emitting cells. The light emitting cells may be made of an $Al_xIn_yGa_zN$ based compound semiconductor which emits ultraviolet or blue light. The light emitting diode chips 13a and 13b may be configured to have the same structure and material, but the present invention is not limited thereto. For example, the light emitting diode chip 13a may emit blue light while the light emitting diode chip 13b may emit ultraviolet light. The structure of the light emitting diode chips and the light emitting cells will be described below in detail with reference to FIG. 9 and FIG. 10.

Meanwhile, the light emitting diode chips 13a and 13b may be arranged within the reflective cup 19. The reflective cup 19 causes the light emitted from the light emitting diode chips to be reflected within a required viewing angle, thereby increasing the luminescence within the certain viewing angle. Accordingly, the reflective cup has a certain inclined surface which depends on the required viewing angle.

Herein, the "long-persistent phosphor" is sometimes referred to as a phosphorescent phosphor and represents a phosphor whose decay time is relatively long after an excitation light source is cut off, wherein the decay time represents an interval during which the luminescence reaches 10% of the initial luminescence after the excitation light source is cut off. In these embodiments, the decay time of the long-persistent phosphor may be equal to or larger than 1 millisecond and more preferably equal to or larger than 8 milliseconds. Meanwhile, the upper limit of the decay time in the long-persistent phosphor is not specifically limited but it may be preferable that the decay time is not too long depending on the application of the light emitting device. For example, in case of the light emitting device used as a conventional household lighting application, it is preferable that the decay time of the long-persistent phosphor is equal to or smaller than several minutes or several seconds.

The long-persistent phosphor 15a is positioned on the light emitting diode chip 13a, thereby performing wavelength conversion for a portion of the light emitted from the light emitting diode chip 13a into light within the visible light range. The long-persistent phosphor 15b is positioned on the light emitting diode chip 13b, thereby performing wavelength conversion for at least a portion of the light emitted from the light emitting diode chip 13b into light within the visible light range.

As shown in the figure, the long-persistent phosphors 15a and 15b may be distributed in a resin such as epoxy or silicone thereby to be configured to cover the light emitting diode chips 13a and 13b, respectively. For example, the epoxy or silicone containing the long-persistent phosphors is separately dotted onto the respective light emitting diode chips so that wavelength conversion members for covering the respective light emitting diode chips may be formed.

For example, the long-persistent phosphors 15a and 15b may comprise $(Zn,Cd)S:Cu$, $SrAl_2O_4:Eu,Dy$, $(Ca,Sr)S:Bi$, ZnSiO$_4$:Eu, (Sr,Zn,Eu,Pb,Dy)O.(Al,Bi)$_2$O$_3$, m(Sr,Ba)O.n (Mg,M)O.2(Si,Ge)O$_2$:Eu,Ln and the like (where $1.5 \leq m \leq 3.5$; $0.5 \leq n \leq 1.5$; M is at least one element selected from the group consisting of Be, Zn, and Cd; and Ln is at least one element selected from the group consisting of Sc, Y, La, Ce, Pr, Nd, Sm, Gd, Tb, Dy, Ho, Er, Tm, Yb, KLu, B, Al, Ga, In, Tl, Sb, Bi, As, P, Sn, Pb, Ti, Zr, Hf, V, Nb, Ta, Mo, W, Cr, and Mn). The long-persistent phosphors 15a and 15b may be excited by the light emitted from the respective light emitting diode chips 13a and 13b to emit light within the visible light range, such as red light, green light, and/or blue light. As such, the light emitted from the long-persistent phosphors 15a and 15b and the light emitted from the light emitting diode chips 13a and 13b may be mixed, whereby there is provided a light emitting device for emitting various colors of light or a light emitting device for emitting white light.

Meanwhile, the respective long-persistent phosphors 15a and 15b may be selected to be different from each other in afterglow luminescence. For example, two kinds of long-persistent phosphors which are different from each other in decay time are selected to be arranged on the light emitting diode chips 13a and 13b, respectively. Further, when the same kind of long-persistent phosphor is used, the long-persistent phosphors 15a and 15b which are distributed on the light emitting diode chips 13a and 13b are allowed to be different from each other in quantity, so that they may be different from each other in afterglow luminescence. For example, the amount of the long-persistent phosphor 15b may be larger than that of the long-persistent phosphor 15a. The amount of the long-persistent phosphor 15a or 15b may be controlled either by adjusting the concentration of the long-persistent phosphor 15a or 15b in the resin containing the long-persistent phosphor 15a or 15b or by adjusting the dotted amount of the is resin containing the long-persistent phosphor 15a or 15b having the constant concentration.

The molding member 17 covers the long-persistent phosphors 15a and 15b. The molding member 17 may contain a diffusion material, which may be used to uniformly mix the light whose wavelength is converted by the long-persistent phosphors 15a and 15b and the light emitted from the light emitting diode chips 13a and 13b.

Meanwhile, general fluorescent phosphors other than the long-persistent phosphors, e.g., red, green, and/or blue phosphors or yellow phosphors, may be included on the light emitting diode chips 13a and 13b. For example, YAG:Ce based phosphors, orthosilicate based phosphors, or sulfide phosphors whose decay time is equal to or smaller than about 1 nanosecond may serve as the general fluorescent phosphors. The long-persistent phosphors and the general fluorescent phosphors may be selected so that the light emitting device may emit the light having the required color. In case of white light, the long-persistent phosphors and the general fluorescent phosphors may be constituted with various combinations of phosphors in order that the light emitted from the light emitting diode chips 13a and 13b and the light whose wavelength is converted by the phosphors may be mixed with each other to form white light.

Even though it is illustrated that the long-persistent phosphors 15a and 15b are in contact with the light emitting diode chips 13a and 13b, the long-persistent phosphors 15a and 15b may be positioned to be spaced apart from the light emitting diode chips 13a and 13b.

During the operation, the light emitting diode chips 13a and 13b simultaneously operate by an external AC power source (not shown), so that the light emitting diode chips 13a and 13b may be repetitively turned on/off depending on a phase change of AC power. While the light emitting diode chips 13a and 13b remain off, a flicker effect is prevented due to the afterglow of the long-persistent phosphors 15a and 15b. Specifically, since the long-persistent is phosphors 15a and 15b are different from each other in afterglow luminescence, the mixed afterglow of the long-persistent phosphors 15a and 15b may cause the flicker effect to be more reduced even though the light emitting diode chips 13a and 13b remain off. Further, by varying the amount of the long-persistent phosphors 15a and 15b positioned on the respective light emitting diode chips 13a and 13b, the light emission output reduction due to at least the light emitting diode chip 13a can be prevented, thereby also preventing the total radiation power reduction.

Figure 2:
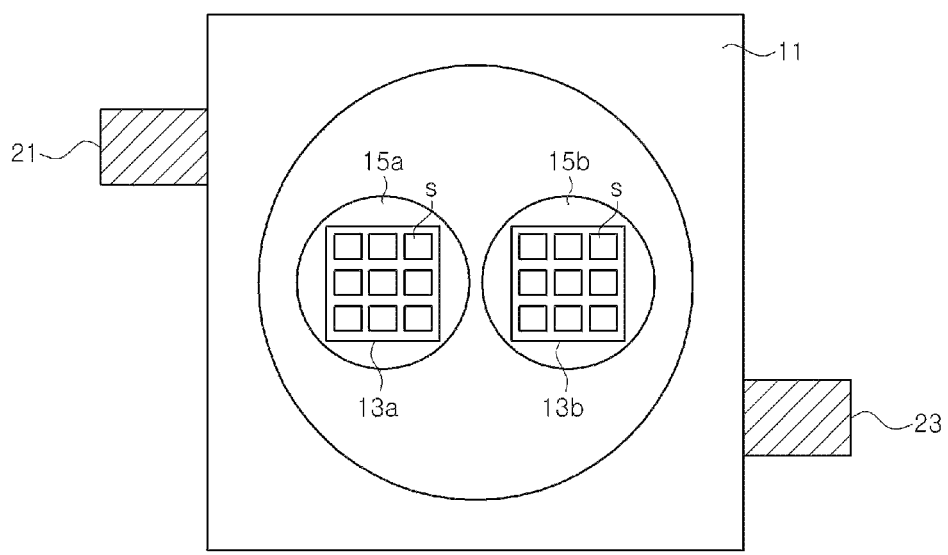
FIG. 2 is a schematic plan view illustrating an AC light emitting device according to an exemplary embodiment of the present invention.
Figure 3:
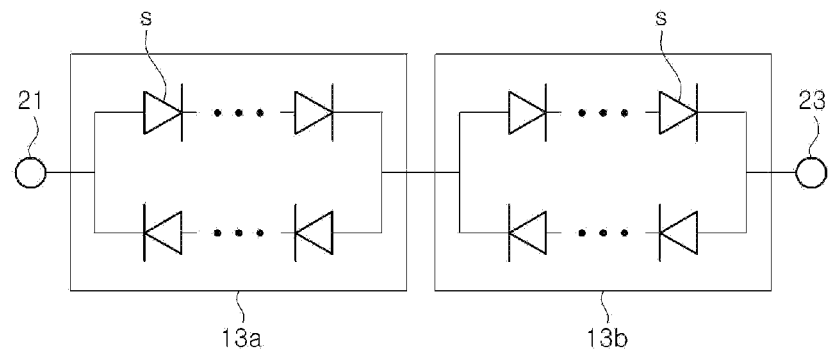
FIG. 3 is an equivalent circuit diagram of the AC light emitting device shown in FIG. 2.

FIG. 2 is a schematic plan view illustrating an AC light emitting device according to an exemplary embodiment of the present invention, and FIG. 3 is an equivalent circuit diagram of the AC light emitting device shown in FIG. 2.

Referring to FIG. 2 and FIG. 3, the light emitting device includes the light emitting diode chips 13a and 13b, lead terminals 21 and 23, and a package body 11, wherein each light emitting diode chip 13a and 13b has a plurality of light emitting cells s, and the long-persistent phosphors 15a and 15b are arranged on the light emitting diode chips 13a and 13b, respectively.

The package body 11 may be made, for example, of plastic or ceramic, wherein the package body has been generally well known. A recess inner wall of the package body 11 may serve as a reflective surface. Meanwhile, the lead terminals 21 and 23 may be formed of lead frames or conductive coating film by a technique such as a plating technique.

As shown in FIG. 3, each of the light emitting diode chips 13a and 13b has arrays of the light emitting cells s which are serially connected to each other, and such arrays are connected to each other in anti-parallel. Further, the light emitting diode chips 13a and 13b are mounted within a recess of the package body 11 and electrically connected to the lead terminals 21 and 23, for example, through bonding wires (not shown). The light emitting diode chips 13a and 13b are also electrically connected to each other through bonding wires (not shown). As such, the light emitting diode chips 13a and 13b may operate by connecting the lead terminals 21 and 23 to an AC power source.

The light emitting device having the package body 11 has been described, but various package types may be used for a light emitting device. For example, exemplary embodiments of the present invention may be applied not only to a lamp type light emitting device, a side surface type light emitting device, a chip type light emitting device, and the like, but also to a high power light emitting device having a heat sink.

Figure 4:
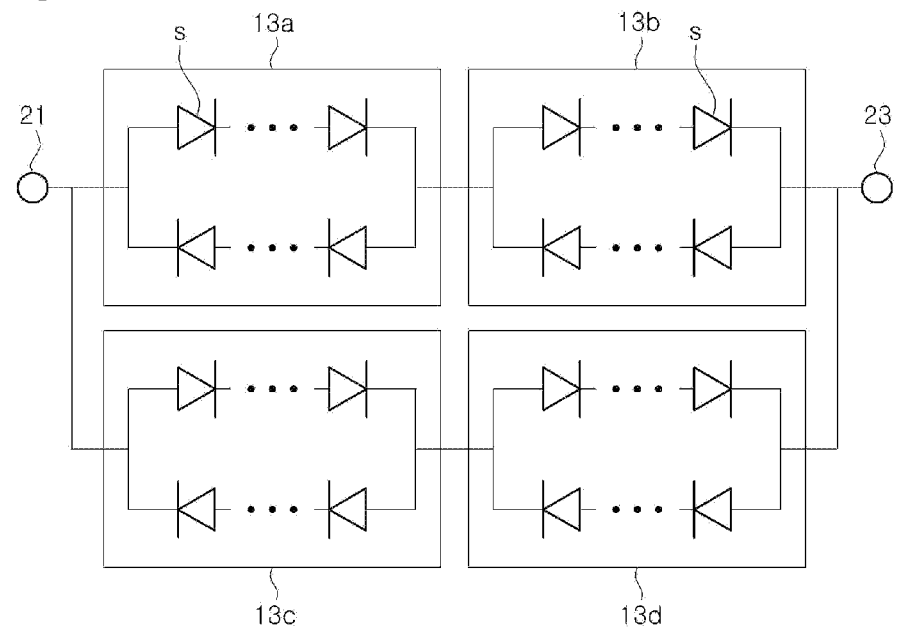
FIG. 4 is a circuit diagram illustrating an AC light emitting device according to another exemplary embodiment of the present invention.

FIG. 4 is a circuit diagram illustrating an AC light emitting device according to another exemplary embodiment of the present invention.

Referring to FIG. 4, in addition to the aforementioned light emitting diode chips 13a and 13b, light emitting diode chips 13c and 13d are further included. The light emitting diode chips 13c and 13d are connected in parallel to the light emitting diode chips 13a and 13b between the lead terminals 21 and 23. Meanwhile, the long-persistent phosphors are arranged on the respective light emitting diode chips 13a, 13b, 13c and 13d. The long-persistent phosphors arranged on the respective light emitting diode chips may be different from each other in afterglow luminescence.

During the operation, the four light emitting diode chips simultaneously operate to emit light. While the light emitting diode chips are turned off depending on a phase change of AC power, the long-persistent phosphors emit light. In addition, an afterglow luminescence difference between the long-persistent phosphors allows a flicker effect to be further alleviated.

Figure 5:
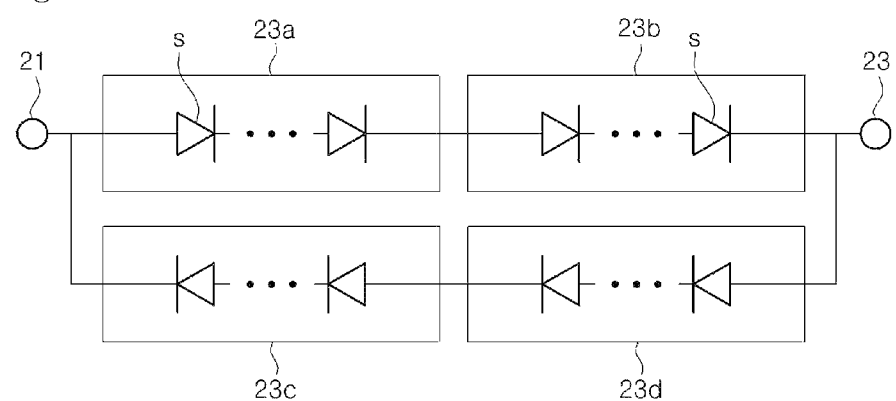
FIG. 5 is a circuit diagram illustrating an AC light emitting device according to another exemplary embodiment of the present invention.

FIG. 5 is a circuit diagram illustrating an AC light emitting device according to another exemplary embodiment of the present invention.

Referring to FIG. 5, each light emitting diode chip 23a, 23b, 23c, or 23d has a single array of a plurality of light emitting cells s. The light emitting diode chips 23a and 23b are serially connected to each other between the lead terminals 21 and 23, the light emitting diode chips 23c and 23d are also serially connected to each other between the lead terminals 21 and 23, and the serially connected light emitting diode chips 23a, 23b, 23c, and 23d are connected in anti-parallel to each other, thereby providing the light emitting device which may operate by AC power.

The long-persistent phosphors are arranged on the respective light emitting diode chips 23a, 23b, 23c, and 23d. The long-persistent phosphors arranged on the respective light emitting diode chips may be different from each other in afterglow luminescence.

The light emitting diode chips 23a and 23b and the light emitting diode chips 23c and 23d alternately operate. While all the light emitting diode chips are turned off depending on a phase change of AC power, the long-persistent phosphors allows light to be emitted, and an afterglow luminescence difference between the long-persistent phosphors allows a flicker effect to be alleviated.

Even though several examples for the connection scheme between the light emitting diode chips have been described, various modifications and changes may be allowed. Further, various numbers of light emitting diode chips may be used, and various light emitting diode chips, which may operate under AC power, may be applied. For example, light emitting diode chips having a bridge rectifier may be used. In this case, one of the light emitting diode chips may have a bridge rectifier while the other light emitting diode chips may be electrically connected to the light emitting diode chip having the bridge rectifier.

Figure 6:
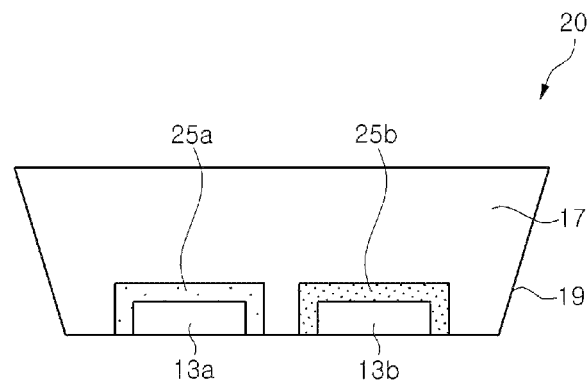
FIG. 6 is a schematic sectional view illustrating an AC light emitting device according to another exemplary embodiment of the present invention.

FIG. 6 is a schematic sectional view illustrating an AC light emitting device is according to another exemplary embodiment of the present invention.

Referring to FIG. 6, the AC light emitting device 20 is generally similar to the AC light emitting device 10, which has been described with reference to FIG. 1, except that long-persistent phosphors 25a and 25b with uniform thicknesses are positioned on the light emitting diode chip 13a and 13b, respectively.

The long-persistent phosphors 25a and 25b may be formed by being coated on the light emitting diode chips 13a and 13b mounted on their chip mounting areas, respectively. Further, the long-persistent phosphors 25a and 25b may be formed by being coated on the light emitting diode chips 13a and 13b in a process of manufacturing the light emitting diode chips 13a and 13b, respectively.

Figure 7:
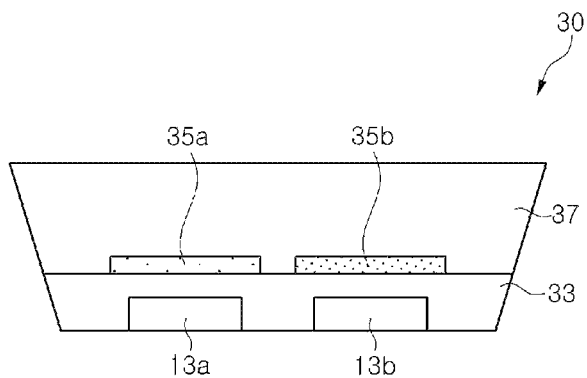
FIG. 7 is a schematic sectional view illustrating an AC light emitting device according to a further exemplary embodiment of the present invention.

FIG. 7 is a schematic sectional view illustrating an AC light emitting device according to a further exemplary embodiment of the present invention.

Referring to FIG. 7, the AC light emitting device 30 is generally similar to the AC light emitting device 10, which has been described with reference to FIG. 1, except that long-persistent phosphors 35a and 35b with uniform thicknesses are positioned above the light emitting diode chip 13a and 13b, respectively. The long-persistent phosphors 35a and 35b may be respectively positioned to be separated from the light emitting diode chips 13a and 13b, for example, by a first molding member 33. The first molding member 33 may be made of a resin such as epoxy or silicone. Meanwhile, a second molding member 37 may cover the long-persistent phosphors 35a and 35b and contain a diffusion material so that light emitted from the light emitting diode chips 13a and 13b may be mixed with light emitted from the long-persistent phosphors 35a and 35b.

Since the long-persistent phosphors 35a and 35b are spaced apart from the light emitting diode chips, it is possible to prevent the yellowing phenomenon of the long-persistent phosphors 35a and 35b due to light or heat emitted from the light emitting diode chips 13a and 13b.

Figure 8:
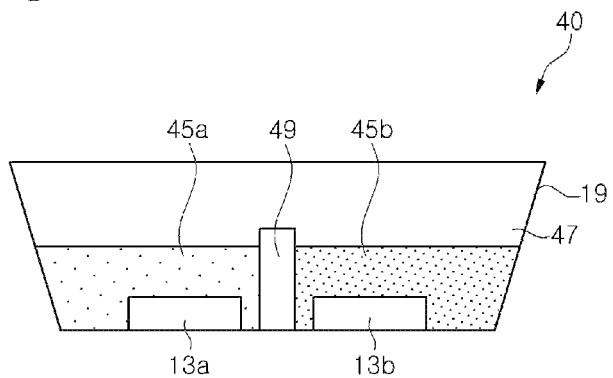
FIG. 8 is a schematic sectional view illustrating an AC light emitting device according to a still further exemplary embodiment of the present invention.

FIG. 8 is a schematic sectional view illustrating an AC light emitting device 40 according to a still further exemplary embodiment of the present invention.

Referring to FIG. 8, the AC light emitting device 40 is generally similar to the AC light emitting device 10, which has been described with reference to FIG. 1, except that long-persistent phosphors 45a and 45b positioned over the light emitting diode chips 13a and 13b are separated by a partition 49. The partition 49 separates the interior of the reflective cup 19 or the recess of the package body into the areas for mounting the respective light emitting diode chips 13a and 13b.

The long-persistent phosphors 45a and 45b may be contained in a resin such as epoxy or silicone, thereby being formed within the areas separated by the partition 49.

Figure 15:
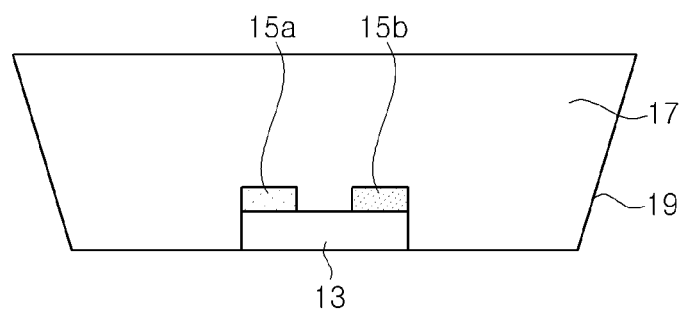
FIG. 15 is a schematic sectional view illustrating an AC light emitting device according to another exemplary embodiment of the present invention.

Even though it has been described in the foregoing exemplary embodiments that the long-persistent phosphors are positioned on the plurality of light emitting diode chips, respectively, the plurality of long-persistent phosphors may be positioned on a single light emitting diode chip having a plurality of light emitting cells. That is, the long-persistent phosphor 15a may be positioned on an area of the light emitting diode chip 13 while the long-persistent phosphor 15b may be positioned on another area of the light emitting diode chip 13, as shown in FIG. 15. If the long-persistent phosphors are different from each other in quantity or kind, they may be different from each other in afterglow luminescence. In addition, another long-persistent phosphor may be positioned on the other area of the light emitting diode chip. The long-persistent phosphors which are different from each other in afterglow luminescence and quantity are positioned on the single light emitting diode chip, so that a flicker effect can also be alleviated in the AC light emitting device using the single light emitting diode chip.

Figure 9:
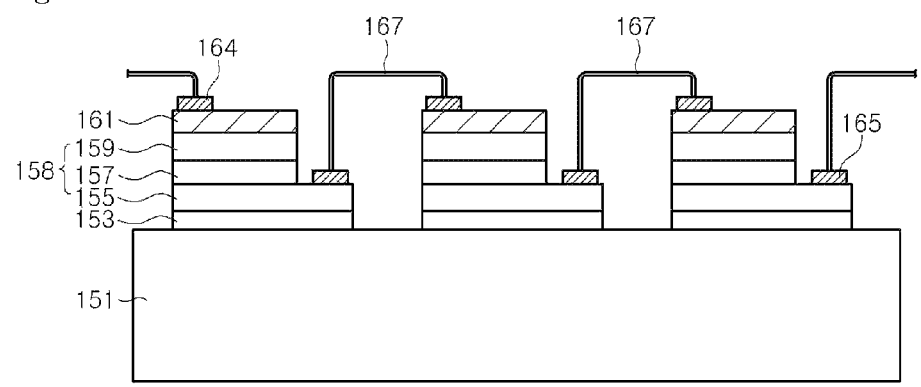
FIG. 9 is a schematic sectional view illustrating a light emitting diode chip which may be used in exemplary embodiments of the present invention.
Figure 10:
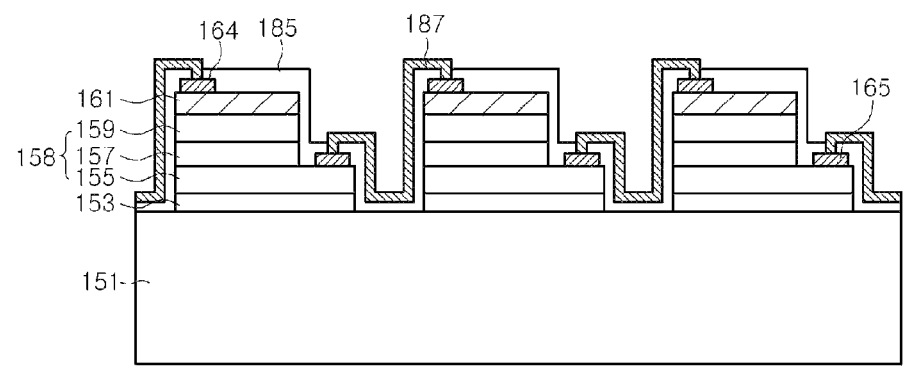
FIG. 10 is a schematic sectional view illustrating a light emitting diode chip which may be used in exemplary embodiments of the present invention.

Hereinafter, a structure of the light emitting cells and their wiring will be described with reference to FIG. 9 and FIG. 10. FIG. 9 and FIG. 10 are partial sectional views illustrating a light emitting diode chip having a plurality of light emitting cells according to exemplary embodiments of the present invention. Here, FIG. 9 is a partial sectional view illustrating that the light emitting cells are serially connected to each other through wires formed by an air-bridge process while FIG. 10 is a partial sectional view illustrating that the light emitting cells are serially connected to each other through wires formed by a step-cover process.

Referring to FIG. 9, a plurality of light emitting cells 158 are positioned on a substrate 151 to be spaced apart from each other. Each of the light emitting cells has a first lower semiconductor layer 155, an active layer 157, and a second upper semiconductor layer 159. The active layer 157 may have a single quantum well structure or a multiple quantum well structure, and the material and composition of the active layer 157 may be selected depending on the required wavelength of the emitted light. For example, the active layer may be made of AlInGaN based compound semiconductor such as InGaN.

Meanwhile, the first lower semiconductor layer 155 and the second upper semiconductor layer 159 may be made of a material of which the band gap is larger than that of the active layer 157 and may be made of AlInGaN based compound semiconductor such as GaN.

Meanwhile, a buffer layer 153 may be interposed between the first lower semiconductor layer 155 and the substrate 151. The buffer layer 153 is adapted to alleviate the lattice mismatch between the substrate 151 and the first lower semiconductor layer 155. The buffer layer 153 may be formed discontinuously as shown in the figure but other configurations are possible. For example, if the buffer layer 153 is made of an insulating material or a large resistive material, the buffer layer may be formed continuously.

As shown in the figure, the second upper semiconductor layer 159 is positioned on a portion of the first lower semiconductor layer 155, and the active layer 157 is interposed between the second upper semiconductor layer 159 and the first lower semiconductor layer 155. Further, a transparent electrode layer 161 may be positioned on the second upper semiconductor layer 159. The transparent electrode layer 161 may be made of a material such as Indium Tin Oxide (ITO), Ni/Au, or the like.

Meanwhile, wires 167 electrically connect the light emitting cells 158. The wires 167 connect the first lower semiconductor layer 155 of one light emitting cell 158 to the transparent electrode layer 161 of its adjacent light emitting cell 158. As shown in the figure, the wires 167 may connect an electrode pad 164 formed on the transparent electrode layer 161 to an electrode pad 165 formed on an exposed area of the first lower semiconductor layer 155. Here, the wires 167 are formed through an air-bridge process so that the other portions except for the contact portion are physically separated from the substrate 151 and the light emitting cells 158. An array of light emitting cells which are serially connected to each other on the single substrate 151 through the wires 167 is formed.

Referring to FIG. 10, the wires for connecting the light emitting cells 158 to each other may be formed by a step cover process. That is, except for the portions for being in contact with wires 187, all the layers of the light emitting cells and the substrate 151 are covered with an insulation layer 185. Then, the wires 187 electrically connect the light emitting cells 158 to each other on the insulation layer 185.

For example, the insulation layer 185 has openings through which the electrode pads 164 and 165 are exposed, and the wires 187 connect the electrode pads 164 and 165 for the adjacent light emitting cells 158 to each other through the openings so that the light emitting cells 158 are serially connected to each other.

Figure 11:
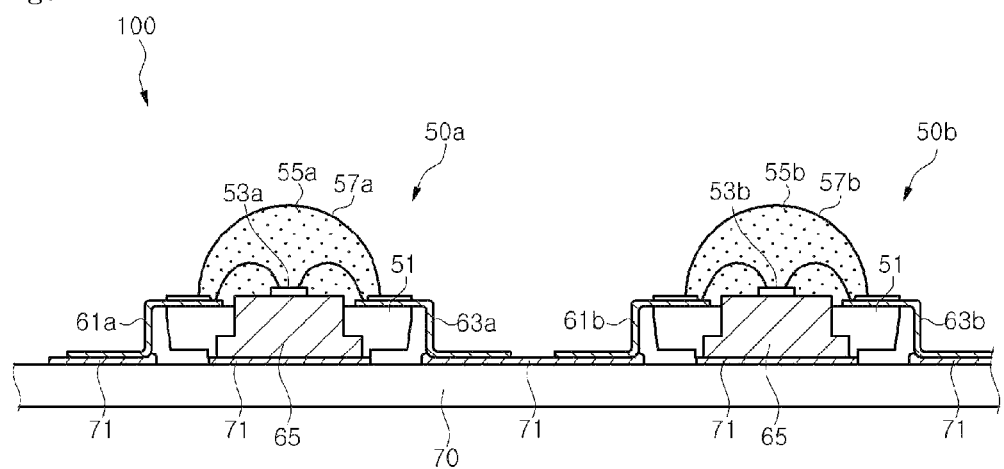
FIG. 11 is a schematic sectional view illustrating an AC light emitting device module according to an exemplary embodiment of the present invention.

FIG. 11 is a schematic sectional view illustrating an AC light emitting device module according to an exemplary embodiment of the present invention.

Referring to FIG. 11, the light emitting device module 100 includes a plurality of light emitting devices, e.g., a first light emitting device 50a and a second light emitting device 50b and may include a substrate, e.g., a printed circuit board 70, for mounting the light emitting cells thereon.

The light emitting devices 50a and 50b have light emitting diode chips 53a and 53b and long-persistent phosphors 55a and 55b and may have package bodies 51, first lead terminals 61a and 61b, second lead terminals 63a and 63b, molding members 57a and 57b and heat sinks 65, respectively.

The package body 51 may be made of plastic or ceramic by an injection molding process, for example on the printed circuit board 70. The package body 51 may be formed with various shapes. Although not shown, the package body may have recesses in which the light emitting diode chips are mounted, and the inner surfaces of which may serve as reflective surfaces. Further, the first lead terminals 61a and 61b and the second lead terminal 63a and 63b may be formed of lead frames or by a plating technique or the like. The heat sinks 65 are to radiate the heat emitted from the light emitting diode chips 53a and 53b and may be made of metal or ceramic with excellent thermal conductivity. The heat sink 65 is supported by the package body 51 and the lower surface of the heat sink 65 is exposed to an external portion of the package body 51.

The first lead terminals 61a and 61b and the second lead terminals 63a and 63b may be attached to the printed circuit board 70, for example, through solders 71. The light emitting devices 50a and 50b may be electrically connected to each other through wires of the printed circuit board 70, so that the module of the light emitting devices 50a and 50b is formed. The heat sinks 65 may also be attached to the printed circuit board 70 through the solders 71.

The molding members 57a and 57b respectively cover the light emitting diode chips 53a and 53b to protect the light emitting diode chips, and may have various shapes by which the directional angle is adjusted. For example, each molding member 57a or 57b may be formed in the shape of a dome as shown in the figure. The molding members may be made of a transparent resin such as epoxy or silicone and contain a diffusion material.

Each of the light emitting diode chips 53a and 53b has a plurality of light emitting cells, which are serially connected to each other to define an array of light emitting cells. The light emitting cells may be made of an $Al_xIn_yGa_zN$ based compound semiconductor which emits ultraviolet or blue light. The light emitting diode chips 53a and 53b may be configured to have the same structure and material, but the present invention is not limited thereto. For example, the light emitting diode chip 53a may emit blue light while the light emitting diode chip 53b may emit ultraviolet light. The structure of the light emitting diode chips and the light emitting cells has been described above in detail with reference to FIG. 9 and FIG. 10.

Meanwhile, the light emitting diode chips 53a and 53b may be mounted in the package body 51 or on the heat sink 65. For example, if the package body 51 has a recess, the light emitting diode chips 53a and 53b may be mounted on the bottom of the recess of the package body 51. The light emitting diode chips 53a and 53b may be electrically connected to the lead terminals through the bonding wires.

The long-persistent phosphor 55a is positioned on the light emitting diode chip 53a, thereby performing wavelength conversion for light emitted from the light emitting diode chip 53a into light within the visible light range. The long-persistent phosphor 55b is positioned on the light emitting diode chip 53b, thereby performing wavelength conversion for light emitted from the light emitting diode chip 53b into light within the visible light range.

As shown in the figure, the long-persistent phosphors 55a and 55b may be distributed in the molding members 57a and 57b thereby to be configured to cover the light emitting diode chips 53a and 53b, respectively. For example, the epoxy or silicone containing the long-persistent phosphors 55a and 55b is separately dotted onto the respective light emitting diode chips 53a and 53b so that wavelength conversion members for covering the respective light emitting diode chips 53a and 53b may be formed.

For example, the long-persistent phosphors 55a and 55b may comprise $(Zn,Cd)S:Cu$, $SrAl_2O_4:Eu,Dy$, $(Ca,Sr)S:Bi$, $ZnSiO_4:Eu$, $(Sr,Zn,Eu,Pb,Dy)O.(Al,Bi)_2O_3$, $m(Sr,Ba)O.n(Mg,M)O.2(Si,Ge)O_2:Eu,Ln$ and the like (where $1.5 \leq m \leq 3.5$;

0.5≤n≤1.5; M is at least one element selected from the group consisting of Be, Zn, and Cd; and Ln is at least one element selected from the group consisting of Sc, Y, La, Ce, Pr, Nd, Sm, Gd, Tb, Dy, Ho, Er, Tm, Yb, KLu, B, Al, Ga, In, Tl, Sb, Bi, As, P, Sn, Pb, Ti, Zr, Hf, V, Nb, Ta, Mo, W, Cr, and Mn). The long-persistent phosphors 55a and 55b may be excited by the light emitted from the respective light emitting diode chips 53a and 53b to emit light within the visible light range, such as red light, green light and/or blue light.

As such, light emitted from the long-persistent phosphors and light emitted from the light emitting diode chips may be mixed, whereby there is provided a light emitting device module 100 for emitting various colors of light or a light emitting device module for emitting white light Meanwhile, the respective long-persistent phosphors 55a and 55b may be selected to be different from each other in afterglow luminescence. For example, two kinds of long-persistent phosphors which are different from each other in decay time are selected to be arranged on the light emitting diode chips 53a and 53b, respectively. Further, when the same kind of long-persistent phosphor 55a and 55b is used, the long-persistent phosphors 55a and 55b which are distributed on the light emitting diode chips 53a and 53b are allowed to be different from each other in quantity, so that they may be different from each other in afterglow luminescence. For example, the amount of the long-persistent phosphor 55b may be larger than that of the long-persistent phosphor 55a. The amount of the long-persistent phosphor 55a and 55b may be controlled either by adjusting the concentration of the long-persistent phosphor 55a and 55b in the resin containing the long-persistent phosphor 55a and 55b or by adjusting the dotted amount of the resin containing the long-persistent phosphor 55a and 55b having the constant concentration. Furthermore, the long-persistent phosphors 55a and 55b different from each other in afterglow luminescence may be implemented by allowing their particle sizes to be different from each other. That is, the average particle size of the long-persistent phosphor 55b may be larger than that of the long-persistent phosphor 55a. The larger the particle size of the long-persistent phosphor, the larger the luminescence. Further, the larger the particle size of the long-persistent phosphor, there is also the larger afterglow luminescence after the same time lapses.

Meanwhile, general phosphors other than the long-persistent phosphors, e.g., red, green and/or blue phosphors, or yellow phosphors, may be included on the light emitting diode chips 53a and 53b. For example, YAG:Ce based phosphors, orthosilicate based phosphors or sulfide phosphors whose decay time is equal to or smaller than about 1 nanosecond may serve as the general phosphors. The long-persistent phosphors and the general fluorescent phosphors may be selected so that the light emitting device may emit the light having the required color. In case of white light, the long-persistent phosphors and the general phosphors may be constituted with various combinations of phosphors in order that the light emitted from the light emitting diode chips 53a and 53b and the light whose wavelength is converted by the phosphors may be mixed with each other to form white light.

Even though it is illustrated that the long-persistent phosphors 55a and 55b are in contact with the light emitting diode chips 53a and 53b, the long-persistent phosphors 55a and 55b may be positioned to be spaced apart from the light emitting diode chips 53a and 53b. For example, the long-persistent phosphors 55a and 55b may be coated on the molding members 57a and 57b. Also, the long-persistent phosphors 55a and 55b may be directly applied to the light emitting diode chips 53a and 53b or positioned between the light emitting diode chip 53a or 53b and the molding member 57a or 57b.

During the operation, the light emitting devices 50a and 50b simultaneously operate by an external AC power source (not shown), so that the light emitting diode chips 53a and 53b may be repetitively turned on/off depending on a phase change of AC power. While the light emitting diode chips 53a and 53b remain off, a flicker effect is prevented due to the afterglow of the long-persistent phosphors 55a and 55b. Specifically, since the long-persistent phosphors 55a and 55b are different from each other in afterglow luminescence, the mixed afterglow of the long-persistent phosphors 55a and 55b may cause the flicker effect to be more reduced even though the light emitting diode chips 53a and 53b remain off. Further, by varying the amount of the long-persistent phosphors 55a and 55b positioned on the respective light emitting diode chips 53a and 53b, the light emission output reduction due to at least one of the light emitting diode chips 53a and 53b can be prevented, thereby also preventing the total radiation power reduction.

Figure 12:
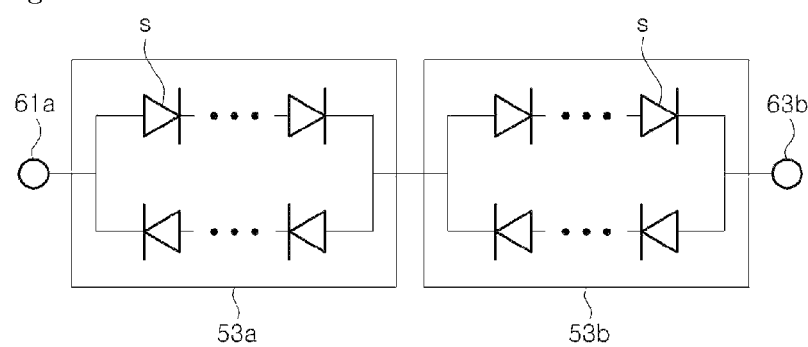
FIG. 12 is a schematic circuit diagram illustrating an AC light emitting device module according to an exemplary embodiment of the present invention.

FIG. 12 is a schematic circuit diagram illustrating an AC light emitting device module according to an exemplary embodiment of the present invention.

Referring to FIG. 12, the light emitting diode chips 53a and 53b each of which has a plurality of light emitting cells s are electrically connected to each other.

Each of the light emitting diode chips 53a and 53b has arrays of the light emitting cells s which are serially connected to each other, and such arrays are connected anti-parallel to each other. The light emitting diode chips 53a and 53b may be electrically connected to the lead terminals 63a and 61b, for example, through bonding wires (not shown), as described above. The lead terminals 63a and 61b may be electrically connected to each other through the printed circuit board 70. As such, the light emitting diode chips 53a and 53b may operate by connecting the lead terminals 61a and 63b to an AC power source.

Figure 13:
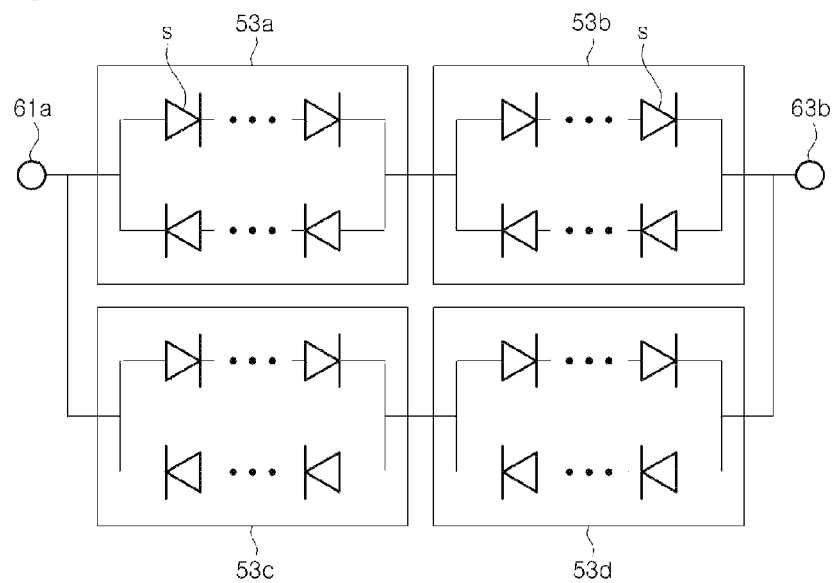
FIG. 13 is a schematic circuit diagram illustrating an AC light emitting device module according to another exemplary embodiment of the present invention.

FIG. 13 is a circuit diagram illustrating an AC light emitting device module according to another exemplary embodiment of the present invention.

Referring to FIG. 13, in addition to the aforementioned light emitting devices 50a and 50b, other light emitting devices are further included. The other light emitting devices respectively include light emitting diode chips 53c and 53d. The light emitting diode chips 53c and 53d are electrically connected to each other so that they are connected to the light emitting diode chips 53a and 53b in parallel. Meanwhile, the long-persistent phosphors are arranged on the respective light emitting diode chips 53a, 53b, 53c, and 53d. The long-persistent phosphors arranged on the respective light emitting diode chips 53a, 53b, 53c, and 53d may be different from each other in afterglow luminescence. As such, there may be provided the AC light emitting device module by which a flicker effect is further alleviated.

Figure 14:
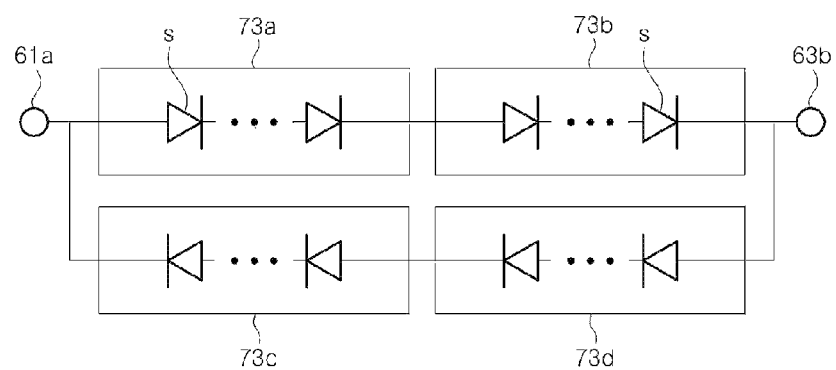
FIG. 14 is a schematic circuit diagram illustrating an AC light emitting device module according a further exemplary embodiment of the present invention.

FIG. 14 is a circuit diagram illustrating an AC light emitting device module according to a further exemplary embodiment of the present invention.

Referring to FIG. 14, each light emitting diode chip 73a, 73b, 73c, or 73d has a single array of a plurality of light emitting cells s. The light emitting diode chips 73a and 73b are serially connected to each other between the lead terminals 61a and 63b, the light emitting diode chips 73c and 73d are also serially connected to each other between the lead terminals 61a and 63b, and the serially connected light emitting diode chips 73a and 73b are connected in anti-parallel to the serially connected light emitting diode chips 73c and 73d, thereby providing the light emitting device module which may operate by AC power.

The long-persistent phosphors are arranged on the respective light emitting diode chips 73a, 73b, 73c, and 73d. The long-persistent phosphors arranged on the respective light emitting diode chips may be different from each other in afterglow luminescence.

During AC power operation, the light emitting diode chips 73a and 73b and the light emitting diode chips 73c and 73d alternately operate. While all the light emitting diode chips are turned off depending on a phase change of AC power, the long-persistent phosphors allows light to be emitted, and an afterglow luminescence difference between the long-persistent phosphors allows a flicker effect to be alleviated.

Even though several examples for the connection scheme between the light emitting devices have been described, various modifications and changes may be allowed. Further, the various number of light emitting devices may be used, and various light emitting diode chips which may operate under AC power may be applied. For example, light emitting diode chips having a bridge rectifier may be used. In this case, one of the light emitting diode chips may have a bridge rectifier while the other light emitting devices may be electrically connected to the light emitting device having the light emitting diode chip including the bridge rectifier.

Further, although the light emitting devices 50a and 50b having the package bodies 51 have been mainly described in this exemplary embodiment, the present invention is not limited to the specific package type of light emitting device having the package bodies 51 but may be applied to other various package types of light emitting device. For example, the present invention may be applied to a lamp type light emitting device, a side surface type light emitting device, a chip type light emitting device, and the like. Further, the light emitting diode chip 53a and 53b may be directly mounted to the printed circuit board 70.

Further, it has been illustrated in these exemplary embodiments that the long-persistent phosphors are used to alleviate a flicker effect, but a delay unit may also be used together with the long-persistent phosphors. Such a delay unit is simultaneously or separately connected to the first light emitting device and/or the second light emitting device, so that the operation of the light emitting cells in the light emitting diode chips in the first and second light emitting device may be delayed to thereby further alleviate the flicker effect.

According to exemplary embodiments of the present invention, at least two long-persistent phosphors being different from each other in afterglow luminescence are arranged. As such, the afterglow luminescence of the long-persistent phosphors may be mixed with each other, so that there may be provided the AC light emitting device capable of alleviating a flicker effect and the AC light emitting device module having the same. Further, the long-persistent phosphors which are different from each other in quantity are arranged on the respective light emitting diode chips, so that the total light emission output may be prevented from being reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An alternating current (AC) light emitting device, comprising:
a light emitting diode chip comprising light emitting cells and comprising an upper surface, the upper surface comprising a first region and a second region;
a first long-persistent phosphor configured to change a wavelength of light emitted from the light emitting diode chip; and
a second long-persistent phosphor configured to change a wavelength of light emitted from the light emitting diode chip,
wherein the first ling-persistent phosphor only covers the first region of the upper surface of the light emitting diode chip, and the second long-persistent phosphor only covers the second region of the upper surface of the light emitting diode chip,
wherein the amount of the second long-persistent phosphor is different from that of the first long-persistent phosphor,
wherein the first region of the upper surface of the light emitting diode chip does not directly contact the second region, and
wherein the decay times of the first long-persistent phosphor and the second long-persistent phosphor are in the range of 1 millisecond to several seconds, and the first long-persistent phosphor and the second long-persistent phosphor differ from each other in afterglow luminance periods.

2. The AC light emitting device of claim 1, wherein the long-persistent phosphors comprise one of $(Zn,Cd)S:Cu$, $SrAl_2O_4:Eu,Dy$, $(Ca,Sr)S:Bi$, $ZnSiO_4:Eu$, $(Sr,Zn,Eu,Pb,Dy)O.(Al,Bi)_2O_3$, and $m(Sr,Ba)O.n(Mg,M)O.2(Si,Ge)O_2:Eu, Ln$,
wherein $1.5 \leq n \leq 3.5$, $0.5 \leq n \leq 1.5$, M is at least one element selected from the group consisting of Be, Zn, and Cd, and Ln is at least one element selected from the group consisting of Sc, Y, La, Ce, Pr, Nd, Sm, Gd, Tb, Dy, Ho, Er, Tm, Yb, K, Lu, B, Al, Ga, In, TI, Sb, Bi, As, P, Sn, Pb, Ti, Zr, Hf, V, Nb, Ta, Mo, W, Cr, and Mn.

3. The AC light emitting device of claim 1, wherein the first long-persistent phosphor and the second long-persistent phosphor comprise different materials from each other.

4. The AC light emitting device as claimed in claim 1, wherein the first long-persistent phosphor and the second long-persistent phosphor are spaced apart from each other.

5. The AC light emitting device as claimed in claim 4, further comprising a partition disposed in between the first long-persistent phosphor and the second long-persistent phosphor.

6. The AC light emitting device as claimed in claim 1, further comprising a molding member disposed on the first long-persistent phosphor and the second long-persistent phosphor, wherein the molding member comprises a diffusion material.

7. The AC light emitting device as claimed in claim 1, wherein the light emitting diode chip comprises at least one array of light emitting cells that are serially connected to each other.

8. The AC light emitting device as claimed in claim 1, wherein the first long-persistent phosphor and the second long-persistent phosphor are disposed on a molding member.

9. The AC light emitting device as claimed in claim 1, further comprising a delay unit.

* * * * *